United States Patent [19]

Gaensslen

[11] 4,128,670

[45] Dec. 5, 1978

[54] FABRICATION METHOD FOR INTEGRATED CIRCUITS WITH POLYSILICON LINES HAVING LOW SHEET RESISTANCE

[75] Inventor: Fritz H. Gaensslen, Yorktown Heights, N.Y.

[73] Assignee: International Business Machines Corporation, Armonk, N.Y.

[21] Appl. No.: 850,586

[22] Filed: Nov. 11, 1977

[51] Int. Cl.$^2$ ............................................. B05D 5/12
[52] U.S. Cl. ...................................... 427/86; 427/88; 427/93; 427/96; 427/272; 357/67
[58] Field of Search ....................... 427/84, 86, 90, 91, 427/93, 96, 88, 272; 357/15, 67

[56] References Cited

U.S. PATENT DOCUMENTS 3,375,418    3/1968    Garnache et al. ...................... 427/86
3,987,216   10/1976    Bhatia et al. ............................ 427/91

OTHER PUBLICATIONS

Rideout; V. L., Reducing the Sheet Resistance of Polysilicon Lines in Integrated Circuits, In IBM Technical Disclosure Bull., vol. 17, No. 6, Nov. 1974, pp. 1831-1833.

*Primary Examiner*—Cameron K. Weiffenbach
*Attorney, Agent, or Firm*—John J. Goodwin

[57] ABSTRACT

A method and structure for polysilicon lines which include a silicide layer for providing a low sheet resistance. The invention may be employed in a polysilicon gate MOSFET process for integrated circuits as well as other integrated structures. In the method a first layer of polysilicon is deposited followed by a deposition of a metal of the silicide forming type. Another polysilicon layer is then deposited on top of the silicide forming metal to produce a three layer structure. The three layer structure is subjected to heat, for example, during the reoxidation step in a gate fabrication process, the metal reacts with the polysilicon at two reaction fronts to form a silicide. The resultant silicide has a much lower resistivity than doped polysilicon and therefore provides a second conductive layer which can be used more compatibly and efficiently in connection with the normal metal layer employed in integrated circuits to give a two-dimensional degree of freedom for the distribution of signals.

12 Claims, 2 Drawing Figures

FABRICATION METHOD FOR INTEGRATED CIRCUITS WITH POLYSILICON LINES HAVING LOW SHEET RESISTANCE

BACKGROUND OF THE INVENTION

1. Field of the Invention

The present invention relates to the fabrication and structure for integrated circuits and more particularly to the fabrication of a MOSFET polysilicon self-aligned gate structure including a silicide forming metal layer between two polysilicon layers.

2. Description of the Prior Art

In integrated circuit fabrication, particularly in the fabrication process for self-aligned gates, polysilicon is used in the prior art for the gate element because the gate element is subjected to high temperatures during the diffusion step in producing the source and drain electrodes and polysilicon can withstand high temperatures similar to refractory metals. Also, in the self-aligned gate process a reoxidation step is performed to provide an oxide over the gate to separate the gate from the metal lines which are later disposed on the top of the structure and the oxide is grown better on polysilicon than on a refractory metal. A prior art structure of this type using polysilicon gate material is shown in FIG. 1 of the drawing.

A disadvantage of the polysilicon gate relative to a refractory metal gate is that it is desirable in many applications to connect the gate to the top layer of metal lines to provide a two-dimensional degree of freedom for the distribution of signals. When polysilicon is used for the gate material there is a mismatch between sheet resistance (ohms per squre cm.) of the metal and the polysilicon which causes inefficiencies such as reduced circuit speed. This disadvantage has been recognized in the prior art and attmepts have been made to avoid the resistivity mismatch. In the IBM Technical Disclosure Bulletin, Vol. 17, No. 6, November 1974, a publication entitled "Reducing the Sheet Resistance of Polysilicon Lines In Integrated Circuits" by V. L. Rideout, is directed to the use of polysilicon lines in multilayer integrated circuits because of the polysilicon's high temperature stability and the fact that silicon dioxide can be deposited or grown on it. The publication teaches that the resistance of the polysilicon lines can be decreased by forming a high-conductivity silicide layer on the exposed surface of the line. That is, the silicide is formed where the metal and the polysilicon meet. More particularly, the polysilicon lines are formed on a silicon dioxide layer over a substrate, a metal such as hafnium is deposited over the entire structure, hafnium silicide is formed over the polysilicon lines but the hafnium remains unreacted on the silicon dioxide regions and is etched away. Then an insulating layer of silicon dioxide is deposited over the structure and an aluminum metalization layer is formed over the silicon dioxide.

The present invention is distinct from the prior art in that a gate structure is formed in the self-aligned gate process wherein a first layer of polysilicon is formed, a silicide forming metal layer is then formed over the first polysilicon layer, and a second polysilicon layer is formed over the silicide forming metal layer. After masking, and during the subsequent reoxidation process, the metal layer reacts at two surfaces with the polysilicon layers and a silicide region is formed. The silicide region is available for a matched connection to the later formed upper metal layer, however the gate structure has a temperature stability property and an upper polysilicon region which provides a good oxide growth during the reoxidation process.

SUMMARY OF THE INVENTION

An object of the present invention is to provide a gate structure for integrated circuits which provides high temperature stability and low sheet resistance.

Another object of the present invention is to provide a low sheet resistance gate structure upon which an oxide can be efficiently formed.

A further object of the present invention is to provide a gate structure for integrated circuits which maintains a work function difference relative to a silicon substrate.

Still another object of the present invention is to provide a gate structure for integrated circuits including a silicide forming metal layer sandwiched between two polysilicon layers wherein the metal reacts with the polysilicon to form a silicide.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
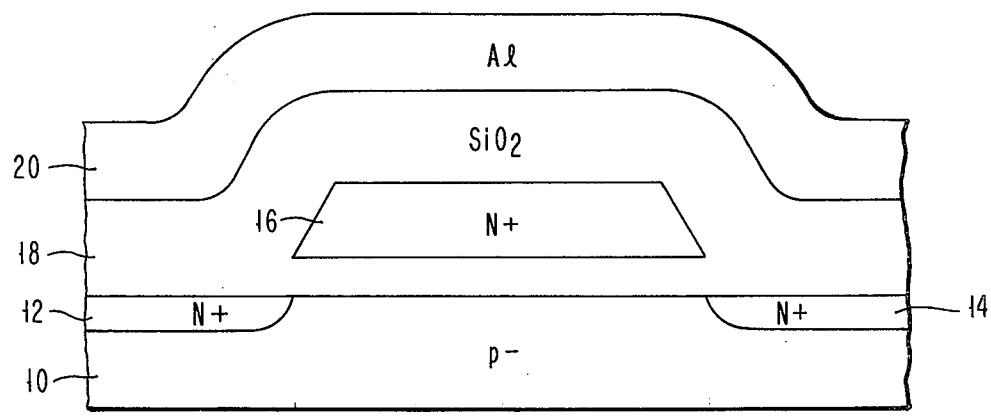
FIG. 1 is an illustration of a gate structure for integrated circuits as known in the prior art.

Referring to FIG. 1, an illustration of a typical polysilicon self-aligned gate is shown including a p type substrate 10 with n+ type source and drain regions 12 and 14. An n+ polysilicon gate 16 is buried in an insulating layer of silicon dioxide ($SiO_2$) 18 and a metalization layer 20 which may be located at the top of the structure.

Polysilicon material is chosen for the layer of which gate 16 is a part, rather than a refractory metal, because it is stable at high temperatures and silicon dioxide can be thermally grown on it or chemically vapor deposited. However, the sheet resistance of polysilicon is orders of magnitude higher than the sheet resistance of the upper metal layer 20, producing a conductivity mismatch which leads to inefficiency such a reduced circuit speed when the polysilicon layer of which gate 16 is a part, also is used for interconnection lines together with the normal metal layer 20. On the other hand, the use of a refractory metal gate selected for its conductivity match has the disadvantage that a native oxide cannot be easily grown on it.

Figure 2:
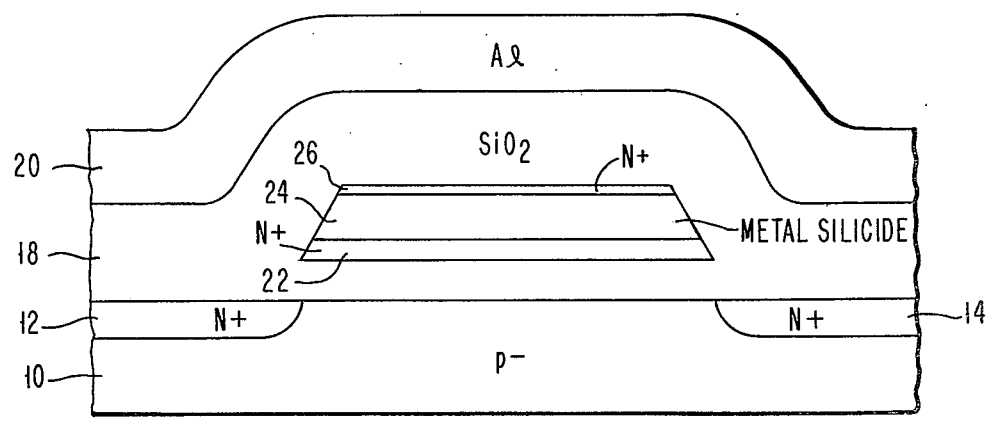
FIG. 2 is an illustration of a gate structure for integrated circuits including a silicide forming metal sandwiched between two polysilicon layers in accordance with the principles of the present invention.

In FIG. 2, an improved structure is illustrated including a similar substrate 10, source and drain regions 12 and 14, and insulating layer 18. The gate however, includes a first layer of polysilicon 22 approximately half as thick as the layer shown in FIG. 1. After layer 22 is deposited a thin layer 24 of silicide forming metal such as molybdenum, tungsten or titanium is deposited on polysilicon layer 22 by a flash deposition and then a second layer 26 of polysilicon approximately the same thickness as layer 22 is deposited on metal layer 24. An important advantage of the invention is that the three layers 22, 24 and 26 can be deposited using the same fabrication steps as in the normal gate process, that is, the deposition of the three layers can be carried out without interrupting the vacuum environment for the deposition and therefore only one vacuum pump down is required.

The three layer structure is next delineated by normal masking steps to produce the gate structure (consisting of layers 22, 24 and 26) as illustrated in FIG. 2. The reoxidation process is then performed to form the silicon dioxide layer above layer 26, and during this process the elevated temperature causes the metal layer 24 to react with polysilicon layers 22 and 26 with two reaction fronts to form a silicide having metallic conductivity.

The preceding discussion related to a description of the present invention as used to fabricate a gate structure for a MOSFET. The invention however, is not limited to this application and may be used more generally, for example, in the fabrication of bipolar devices and for polysilicon conductors or lines in multilayer circuits. Thus polysilicon lines may be fabricated with a sandwiched silicide layer according to the principles of the present invention so as to incorporate the temperature stability and reoxidation properties of polysilicon and the low sheet resistance of the silicide.

Other integrated circuit applications of the present invention include one-device cell memories and logic arrays. In the one-device cell the present silicide structure described herein can be used to maintain a low sheet resistance for the bit line without increasing the bit line capacitance, thereby improving device sensitivity as a result of improved coupling.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating an electrically conductive combined polysilicon and metal silicide structure for integrated circuits comprising the steps of depositing a first layer of polysilicon on a substrate,
    depositing a layer of silicide forming metal on said first polysilicon layer,
    depositing a second layer of polysilicon on said silicide forming metal layer,
    and heating said polysilicon and metal structure to cause said metal layer to react with said first and second polysilicon layers to form a metal silicide layer intermediate said first and second polysilicon layers.

2. A method for fabricating a polysilicon and metal silicide structure according to claim 1 wherein said silicide forming metal is selected to produce an electrically conductive silicide having a resistivity substantially at least an order of magnitude lower than the resistivity of said polysilicon.

3. A method according to claim 1 wherein said silicide forming metal is molybdenum.

4. A method according to claim 1 wherein said silicide forming metal is tungsten.

5. A method according to claim 1 wherein said silicide forming metal is titanium.

6. A method for fabricating a polysilicon and metal silicide structure according to claim 1 wherein said heating step also produces a layer of oxide on the upper surface of said second layer of polysilicon.

7. A method for fabricating a polysilicon and metal silicide structure according to claim 6 further including the step of forming a metal layer on said oxide layer.

8. A method according to claim 7 wherein said metal layer is composed of aluminum.

9. A method for fabricating a gate electrode for an integrated circuit comprising the steps of depositing a first oxide layer on a semiconductor substrate,
    depositing a first layer of polysilicon on said first oxide layer,
    depositing a layer of silicide forming metal of said first polysilicon layer,
    depositing a second layer of polysilicon on said silicide forming metal layer to form a three-layer structure disposed on said first oxide layer on said semiconductor substrate,
    masking and delineating said three layer structure to form a gate electrode element,
    heating said combination to form a second oxide layer over said gate electrode element and to cause said silicide forming metal to react with said first and second polysilicon layers to form a silicide layer intermediate said first and second polysilicon layers.

10. A method for fabricating a polysilicon and metal silicide structure according to claim 9 wherein said silicide forming metal is selected to produce an electrically conductive silicide having a resistivity substantially at least an order of magnitude lower than the resistivity of said polysilicon.

11. A method according to claim 10 further including the step of forming a metal layer over said second oxide layer.

12. A method according to claim 11 wherein said metal layer is composed of aluminum.

* * * * *